United States Patent
Roen et al.

(10) Patent No.: US 6,647,621 B1
(45) Date of Patent: Nov. 18, 2003

(54) ELECTRICAL RESISTANCE REDUCTION METHOD FOR THERMOSETTING CONDUCTIVE EPOXY CONTACTS IN INTEGRATED LEAD SUSPENSIONS

(75) Inventors: Michael E. Roen, Hutchinson, MN (US); Larry C. Webb, Jr., Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 371 days.

(21) Appl. No.: 09/809,587

(22) Filed: Mar. 15, 2001

Related U.S. Application Data
(60) Provisional application No. 60/191,940, filed on Mar. 24, 2000.

(51) Int. Cl.[7] ............................................. H01R 43/16
(52) U.S. Cl. ............................. 29/874; 29/621; 29/877; 29/878
(58) Field of Search .................. 29/620, 621, 874, 29/876, 877, 878; 360/104–106, 97.02, 97.03, 97.04, 98.01, 108; 338/32 R, 32 H, 330, 322

(56) References Cited

U.S. PATENT DOCUMENTS

| 4,401,966 | A | * | 8/1983 | Ohmura et al. ........... 338/32 R |
| 5,839,193 | A | * | 11/1998 | Bennin et al. ............. 29/896.9 |
| 5,844,751 | A | * | 12/1998 | Bennin et al. ........... 360/244.3 |
| 5,982,584 | A | * | 11/1999 | Bennin et al. ........... 360/245.9 |

* cited by examiner

Primary Examiner—Timothy V. Eley
(74) Attorney, Agent, or Firm—Faegre & Benson LLP

(57) ABSTRACT

A method for efficiently producing low resistance electrical contacts between stainless steel and conductive layers in integrated lead suspensions and components. The method includes applying an amount of current for a period of time which is effective to reduce the resistance to a desired level. One embodiment of the invention includes applying a 100 mA current for 16 msec to a contact formed by thermosetting conductive epoxy. Resistance levels below 1 ohm can be achieved.

34 Claims, 4 Drawing Sheets

ELECTRICAL RESISTANCE REDUCTION METHOD FOR THERMOSETTING CONDUCTIVE EPOXY CONTACTS IN INTEGRATED LEAD SUSPENSIONS

This application claims the benefit of Provisional Application No. 60/191,940 filed Mar. 24, 2000.

FIELD OF THE INVENTION

The present invention relates generally to integrated lead head suspensions such as those used in magnetic disk drives. In particular, the invention is a method for reducing the electrical resistance of contacts between different layers of conductors in the integrated lead suspensions.

BACKGROUND OF THE INVENTION

Integrated lead suspensions, and associated components (e.g., integrated lead flexures) are well known and disclosed, for example, in the Bennin et al. U.S. Pat. Nos. 5,893,193, 5,844,751, and 5,982,584. Briefly, these suspensions and components (hereinafter referred to as suspensions) include a copper or copper alloy conductor layer and a stainless steel layer or other spring metal base layer separated by a layer of polyimide or other insulator. Electrical leads used to conduct signals between the read/write head supported by the suspension and the disk drive electronics are formed in the conductor layer.

It is sometimes desirable to use the stainless steel layer of the suspension as a ground or for other signal transmission purposes. One known approach for providing this functionality is to electrically interconnect one of the leads in the conductor layer to the stainless steel layer. Electrical connections of this type can be made by forming a hole or aperture through the conductor and dielectric layers to expose the stainless steel layer. Flowable conductive material such as conductive epoxy adhesive is then deposited into the hole and allowed to set or harden (e.g., when cured at an elevated temperature in the case of thermosetting conductive epoxy). This conductive material functions as an electrical contact between the stainless steel and conductive material layers.

It has been observed that the electrical resistance of conductor-to-stainless steel contacts of the type described above is in the range of 20 ohms or even higher. Oxidation of the surface of the stainless steel in contact with the conductive material is one explanation offered for these relatively high resistance levels. Irrespective of the cause, these resistance levels can reduce the electrical performance of the suspension. There is, therefore, a need for improved electrical contact structures and/or associated resistance reduction methods for use in integrated lead suspensions. In particular, there is a need for structures and/or associated methods for providing integrated lead conductor-to-stainless steel layer electrical contacts having relatively low resistances. Any such structures and methods should be mechanically stable and efficient to fabricate.

SUMMARY OF THE INVENTION

The present invention is a method for efficiently producing low electrical resistance contacts between the stainless steel and conductor layers in integrated lead suspensions. The method includes applying an amount of current for a period of time which is effective to reduce the resistance to a desired level. One embodiment of the invention includes applying a 100 mA current for 16 msec to a contact formed by thermosetting conductive epoxy. Contact resistance values can be reduced to less than 1 ohm by the method.

DETAILED DESCRIPTION

Figure 1:
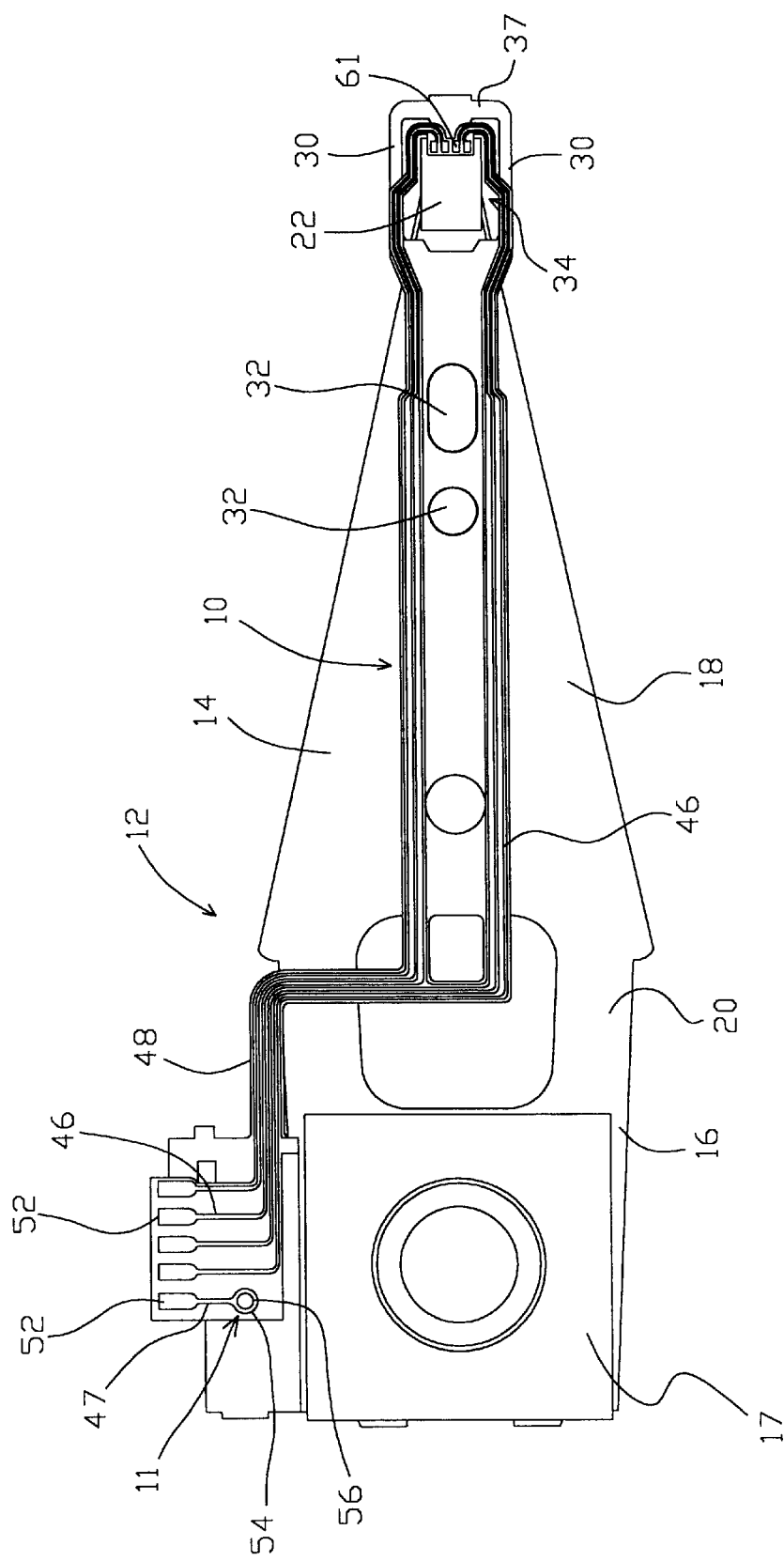
FIG. 1 is an illustration of an integrated lead suspension which includes an electrical contact which can be processed in accordance with the present invention to reduce its electrical resistance.

FIG. 1 is an illustration of an integrated lead head suspension 12 having a conductor-to-stainless steel contact 11 which can be processed in accordance with the present invention. In the embodiment shown, the suspension 12 includes a stainless steel load beam 14 with an integrated lead flexure 10 welded or otherwise attached to the load beam. Load beams such as 14 are well known and commercially available. As shown, the load beam 14 includes a mounting region 16 at its proximal end, a relatively rigid region 18 and a spring region 20 between the mounting and rigid regions. A base plate 17 is welded to the mounting region 16. The flexure 10 is configured to have a slider (not shown) adhesively bonded or otherwise mounted to a slider bonding platform 22.

Figure 2:
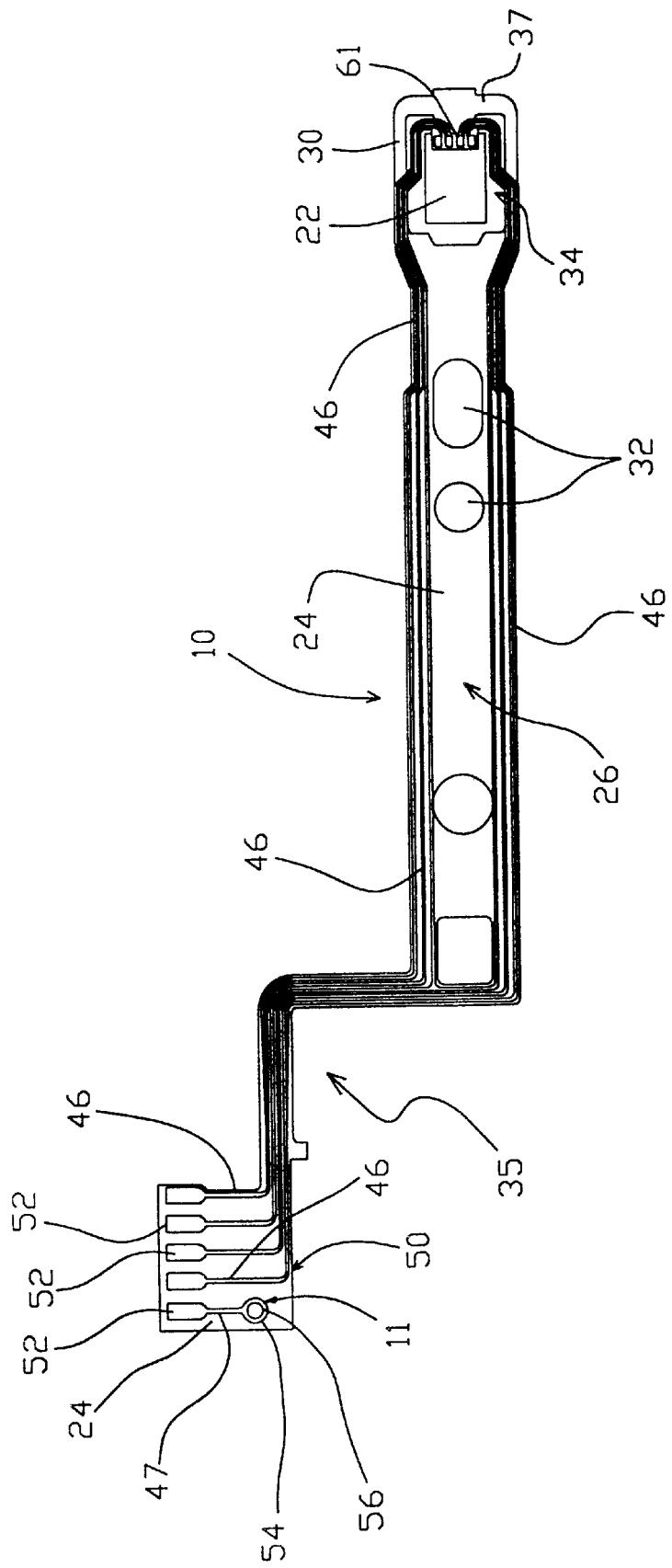
FIG. 2 is an illustration of the integrated lead flexure component of the suspension shown in FIG. 1.

The flexure 10 can be described in greater detail with reference to FIG. 2. As shown, flexure 10 includes a base layer 24 having a mounting region 26, flexure or gimbal region 34 and a tail 35. The base region 26 is configured to be attached to the rigid region 18 of the load beam. Alignment holes 32 in the base region 26 are used to accurately position flexure 10 on the load beam 14 during assembly. The gimbal region 34 is located at the distal end of the flexure 10 and includes spring arms 30, cross member 37 and slider bonding platform 22. The tail 35 is located at the proximal end of the flexure 10 and has terminal pad 50 at its end. The base layer 24 of the flexure 10 is typically formed from stainless steel or other conductive spring material.

Signal leads 46 extend across the flexure 10 between bond pads 61 on the slider bonding platform 22 and the terminal pad 50. A grounding lead 47 extends across the terminal pad 50 to the contact 11. Leads 46 and 47 are formed of copper alloy or other conductive material in a layer over the stainless steel base layer 24. Although not shown in FIG. 2, a layer of gold is typically plated on the leads 46 and 47. The proximal ends of the leads 46 and 47 end at terminals 52. Although not visible in FIG. 1 or 2, a layer of dielectric or other insulator material separates the leads 46 and 47 from the stainless steel base layer 24 at the locations at which the leads overlay the base layer. Conventional deposition (i.e., additive) or etching (i.e., subtractive) manufacturing processes can be used to fabricate flexures 10.

Figure 3:
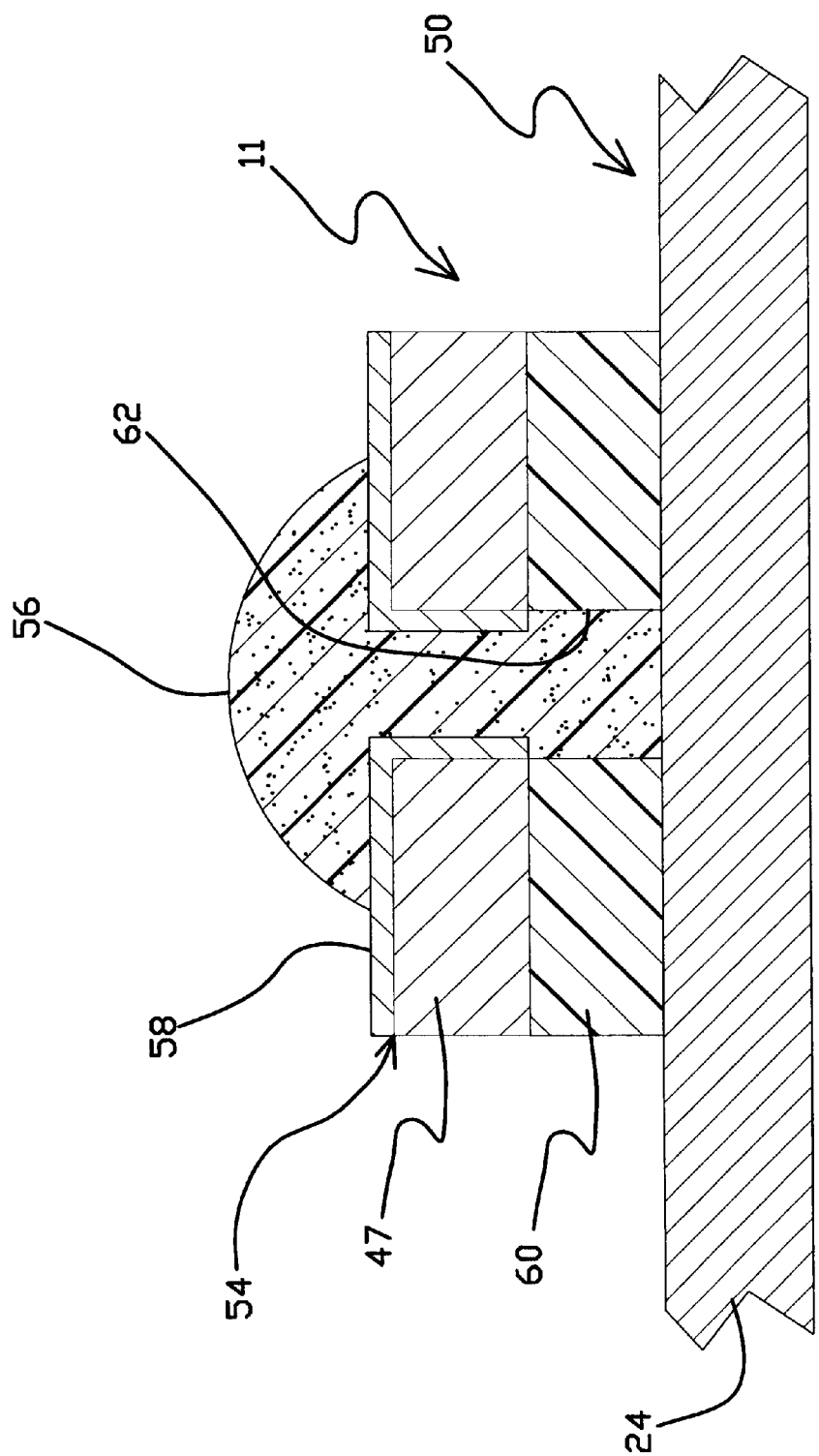
FIG. 3 is a detailed cross sectional view of the conductor-to-stainless steel electrical contact shown in FIGS. 1 and 2.

Grounding lead 47 electrically interconnects the associated terminal pad 52 to conductor-to-stainless steel contact 11. The contact 11 includes an enlarged contact area 54 in the lead 47, and a volume of conductive epoxy adhesive 56 within a hole extending through the contact area and underlying dielectric layer (not visible in FIG. 2). FIG. 3 is a detailed cross section of the contact 11. As shown, the contact area 54 in the lead 47 is coated with gold plating 58 and electrically insulated from the stainless steel base layer 24 by dielectric layer 60. An aperture or hole 62 through the contact area 54 in the grounding lead 47 and the underlying portion of dielectric layer 60 is filled with conductive epoxy 56. The conductive epoxy 56 electrically interconnects the lead 47 to the stainless steel base layer 24 (i.e., the contact interconnects two conductive layers separated by an insulator layer).

The hole 62 can be formed in a conventional manner during the fabrication of flexure 10. By way of example, in a flexure 10 fabricated using a subtractive process, the hole 62 can be etched through the layer of conductive material forming the lead 47 at the contact area 54 and through the underlying dielectric layer 60. Thermosetting conductive epoxy adhesive 56 having 80% silver is used in one embodiment of the invention. In this embodiment the adhesive 56 is applied to the hole 62 in a flowable form, and hardened or set by exposing the adhesive to an elevated temperature (e.g., by baking the adhesive in an oven). Hysol K00120 adhesive available from Dexter Electronics Materials of Industry, California, is an example of an adhesive which can be used in this application. However, other conductive materials (e.g., conductive polymers or solder) can also be used to form the electrical contact between the lead 47 and base layer 24.

Figure 4:
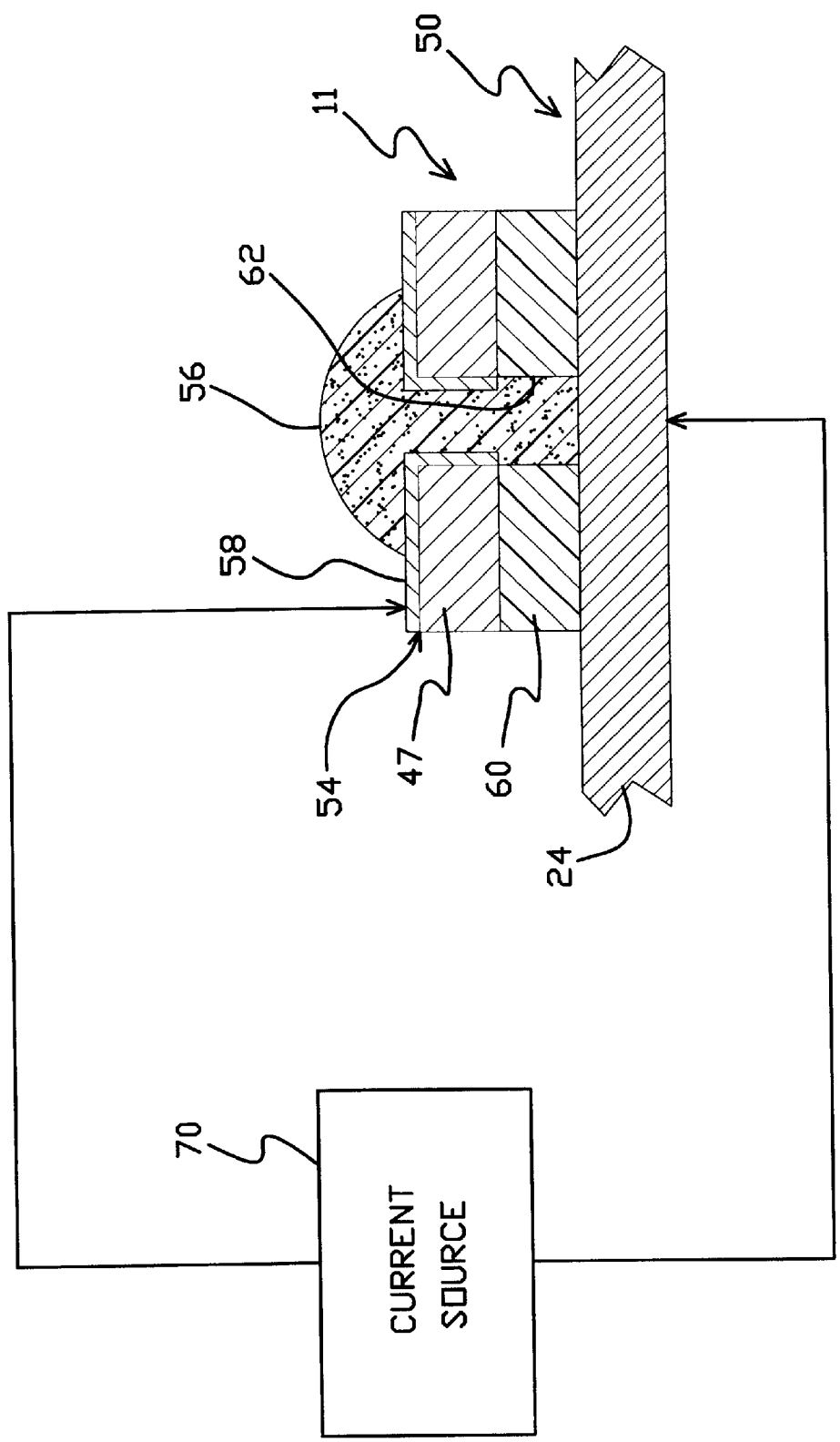
FIG. 4 is a schematic illustration of a current source connected to the contact shown in FIG. 3 for performing the resistance reduction method of the present invention.

It has been discovered that the electrical resistance of a contact 11 of the type described above can be reduced by applying an electric current across or through the contact. FIG. 4 is a diagrammatic illustration of a current source 70 which can be electrically interconnected to the contact 11 to carry out the resistance reduction method of the present invention. In general, the magnitude of the current and the time period during which the current is applied are optimized to effectively reduce the resistance of the contact to desired levels. A range of current levels and application time periods can be effective for this purpose. AC or DC currents can be used. For example, tests have demonstrated that electric currents between 90 mA and 500 mA, when applied through the contact 11 for between about 1 and 30 msec, can be effective to reduce the resistance of the contact to values below about 5 ohms. In one preferred embodiment, currents in the range between about 100 mA and 200 mA, when applied to the contact 11 for between about 20 and 30 msec, were demonstrated to be effective at reducing the resistance of the contact. In another preferred embodiment, a current of about 100 mA is applied for about 16 msec to reduce the resistance. Tests have demonstrated that these approaches are effective for reducing the resistance of the contact 11 from levels in the range of about 10 ohms to 20 ohms to between 1 ohm and 5 ohms. Resistance values less than 1 ohm can also be achieved by this method. The magnitude of the current applied to the contact 11 to reduce the resistance will generally be greater than the magnitude of current levels of the read and write signals transmitted by the leads 46 and 47 during normal operation of the disk drive for which the suspension 12 is configured for operation.

Integrated lead suspensions 12 of the type described above are generally subjected to electrical tests following their manufacture. During these tests the leads 46 and 47 are tested for electrical continuity and shorts. The resistance reduction method of the present invention and described above can be efficiently performed during these electrical tests.

The present invention offers important advantages. In particular, it substantially reduces the resistance of conductor-to-stainless steel and other electrical contacts without affecting the mechanical integrity of the contact. The method can also be efficiently performed.

Although the present invention has been described with reference to preferred embodiments, those skilled in the art will recognize that changes can be made in form and detail without departing from the spirit and scope of the invention.

Tests have determined that the method described herein can be performed after the conductive material 56 has set or hardened, or while the material is setting.

The invention is not to be taken as limited to all of the details thereof as modifications and variations thereof may be made without departing from the spirit or scope of the invention.

What is claimed is:

1. A method for reducing electrical resistance in a contact formed by a settable conductive material between a metal base layer and a conductor layer in a head suspension or a head suspension component, where the contact is characterized by an initial electrical resistance, the method comprising applying an electric current to the conductive material after the conductive material has set and in an amount and for a time sufficient to reduce the electrical resistance of the contact to a value substantially less than the initial resistance.

2. The method of claim 1 wherein the settable conductive material is a conductive adhesive.

3. The method of claim 1 wherein the metal base layer is a stainless steel layer.

4. The method of claim 1 wherein the settable conductive material is a thermosetting conductive adhesive.

5. The method of claim 1 wherein the contact further comprises locating the conductive material in an aperture in a dielectric layer between the base layer and the conductor layer.

6. The method of claim 1 wherein the electric current is between about 90 milliamperes and about 500 milliamperes.

7. The method of claim 1 wherein the initial resistance is above about 10 ohms.

8. The method of claim 1 wherein the time is a time sufficient to reduce the resistance to less than about 5 ohms.

9. The method of claim 1 wherein the time is a time sufficient to reduce the resistance to less than about 1 ohm.

10. The method of claim 1 wherein the time is between about 1 millisecond and about 30 milliseconds.

11. The method of claim 1 wherein the electric current is about 100 milliamperes and the time is about 16 milliseconds.

12. The method of claim 1 wherein the electric current is an AC current.

13. The method of claim 1 wherein the electric current is a DC current.

14. A method for reducing electrical resistance in a contact formed by a settable conductive material between a metal base layer and a conductor layer separated by a dielectric layer in a head suspension or a head suspension component, where the contact is characterized by an initial electrical resistance, the method comprising applying an electric current to the conductive material after the conductive material has set and in an amount and for a time sufficient to reduce the electrical resistance of the contact to a value substantially less than the initial resistance.

15. The method of claim 14 wherein the settable conductive material is a conductive adhesive.

16. The method of claim 14 wherein the metal base layer is a stainless steel layer.

17. The method of claim 14 wherein the settable conductive material is a thermosetting conductive adhesive.

18. The method of claim 14 wherein the contact further comprises locating the conductive material in an aperture in the dielectric layer between the base layer and the conductor layer.

19. The method of claim 14 wherein the electric current is between about 90 milliamperes and about 500 milliamperes.

20. The method of claim 14 wherein the initial resistance is above about 10 ohms.

21. The method of claim 14 wherein the time is a time sufficient to reduce the resistance to less than about 5 ohms.

22. The method of claim 14 wherein the time is a time sufficient to reduce the resistance to less than about 1 ohm.

23. The method of claim 14 wherein the time is between about 1 millisecond and about 30 milliseconds.

24. The method of claim 14 wherein the electric current is about 100 milliamperes and the time is about 16 milliseconds.

25. The method of claim 14 wherein the electric current is an AC current.

26. The method of claim 14 wherein the electric current is a DC current.

27. A method for reducing electrical resistance in a contact formed by a settable conductive material between a metal base layer and a conductor layer in a head suspension assembly where the contact is characterized by an initial electrical resistance, the method comprising applying a predetermined level of electric current to the conductive material after the conductive material has set for a time sufficient to reduce the electrical resistance of the contact to a value substantially less than the initial resistance.

28. The method of claim 27 wherein the settable conductive material is a conductive epoxy.

29. The method of claim 27 wherein the conductor layer is formed of copper.

30. The method of claim 27 wherein the metal base layer is formed of stainless steel.

31. The method of claim 27 wherein the initial electrical resistance is above about 10 ohms.

32. The method of claim 27 wherein the predetermined level of electric current is above about 90 milliamperes.

33. The method of claim 27 wherein the time sufficient to reduce the electrical resistance is about at least 16 milliseconds.

34. The method of claim 27 wherein the electrical resistance of the contact is reduced to less than about 5 ohms.

* * * * *